United States Patent
Jorgensen et al.

(10) Patent No.: US 10,808,555 B2
(45) Date of Patent: Oct. 20, 2020

(54) QUINARY, LOW-CONDUCTIVITY THERMAL BARRIER COATINGS FOR TURBINE ENGINE COMPONENTS

(71) Applicant: HONEYWELL INTERNATIONAL INC., Morris Plains, NJ (US)

(72) Inventors: David John Jorgensen, Phoenix, AZ (US); Wil Baker, Phoenix, AZ (US); Vladimir K. Tolpygo, Scottsdale, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 225 days.

(21) Appl. No.: 15/860,861

(22) Filed: Jan. 3, 2018

(65) Prior Publication Data

US 2019/0203603 A1 Jul. 4, 2019

(51) Int. Cl.
  C23C 4/11 (2016.01)
  F01D 5/28 (2006.01)
  (Continued)

(52) U.S. Cl.
  CPC .............. F01D 5/288 (2013.01); C04B 35/48 (2013.01); C04B 35/488 (2013.01);
  (Continued)

(58) Field of Classification Search
  CPC . F01D 5/28; F01D 9/041; C23C 4/134; C23C 14/30; C23C 28/3215; C23C 28/3455; C23C 4/11; C23C 14/083; C04B 35/48; C04B 35/50; C04B 35/505; C04B 35/488; C04B 35/62222; C04B 35/495; C04B 2235/3251; C04B 2235/3275; C04B 2235/9607; C04B 2235/765; C04B 2235/80; C04B 2235/3279;
  (Continued)

(56) References Cited

U.S. PATENT DOCUMENTS 6,869,703 B1   3/2005  Spitsberg et al.
7,309,530 B2  12/2007  Spitsberg et al.
(Continued)

FOREIGN PATENT DOCUMENTS

EP  0115148 A2  8/1984
EP  1507022 A1  2/2005
(Continued)

OTHER PUBLICATIONS

Wang, D.; Design of Novel Thermal Barrier Coatings with Reduced Thermal Conduction and Thermal Radiation; Nov. 2006.
(Continued)

*Primary Examiner* — Jonathan C Langman
(74) *Attorney, Agent, or Firm* — Lorenz & Kopf, LLP

(57) ABSTRACT

Thermal barrier coatings, which may be used in gas turbine engines, comprise or consist of a tantala-niobia-zirconia mixture that is stabilized with two or more stabilizers. An exemplary thermal barrier coating comprises or consists of, by mole percent: about 2% to about 30% $YO_{1.5}$; about 8% to about 30% $YbO_{1.5}$ or $GdO_{1.5}$ or combination thereof; about 6% to about 30% $TaO_{2.5}$; about 0.1% to about 10% $NbO_{2.5}$; about 0% to about 10% $HfO_2$; and a balance of $ZrO_2$.

28 Claims, 2 Drawing Sheets

(51) Int. Cl.
| | |
|---|---|
| *F01D 9/04* | (2006.01) |
| *C04B 35/495* | (2006.01) |
| *C04B 35/622* | (2006.01) |
| *C23C 28/00* | (2006.01) |
| *C23C 14/30* | (2006.01) |
| *C04B 35/488* | (2006.01) |
| *C04B 35/505* | (2006.01) |
| *C04B 35/50* | (2006.01) |
| *C04B 35/48* | (2006.01) |
| *C23C 4/134* | (2016.01) |
| *C23C 14/08* | (2006.01) |

(52) U.S. Cl.
CPC ............ *C04B 35/495* (2013.01); *C04B 35/50* (2013.01); *C04B 35/505* (2013.01); *C04B 35/62222* (2013.01); *C23C 4/11* (2016.01); *C23C 4/134* (2016.01); *C23C 14/30* (2013.01); *C23C 28/3215* (2013.01); *C23C 28/3455* (2013.01); *F01D 9/041* (2013.01); *C04B 2235/3225* (2013.01); *C04B 2235/3241* (2013.01); *C04B 2235/3244* (2013.01); *C04B 2235/3251* (2013.01); *C04B 2235/3275* (2013.01); *C04B 2235/3279* (2013.01); *C04B 2235/3289* (2013.01); *C04B 2235/765* (2013.01); *C04B 2235/80* (2013.01); *C04B 2235/9607* (2013.01); *C23C 14/083* (2013.01); *F05D 2230/90* (2013.01); *F05D 2240/12* (2013.01); *F05D 2240/24* (2013.01); *F05D 2260/231* (2013.01); *F05D 2300/5023* (2013.01)

(58) Field of Classification Search
CPC .... C04B 2235/3289; C04B 2235/3244; C04B 2235/3241; C04B 2235/3225; F05D 2230/90; F05D 2260/231; F05D 2240/24; F05D 2240/12; F05D 2300/5023
See application file for complete search history.

(56) References Cited

U.S. PATENT DOCUMENTS

| | | | |
|---|---|---|---|
| 7,374,821 B2* | 5/2008 | Leclercq | ............... C04B 35/486 428/469 |
| 7,700,508 B1* | 4/2010 | Zhu | ......................... C04B 35/49 501/103 |
| 2002/0172838 A1 | 11/2002 | Rigney et al. | |
| 2004/0043244 A1 | 3/2004 | Bruce et al. | |
| 2005/0112412 A1 | 5/2005 | Darolia et al. | |
| 2005/0142394 A1 | 6/2005 | Spitsberg et al. | |
| 2006/0019119 A1 | 1/2006 | Spitsberg et al. | |
| 2006/0046090 A1 | 3/2006 | Spitsberg et al. | |
| 2006/0166015 A1 | 7/2006 | Spitsberg et al. | |
| 2006/0166017 A1 | 7/2006 | Spitsberg et al. | |
| 2010/0242797 A1 | 9/2010 | Nagano et al. | |
| 2014/0271218 A1 | 9/2014 | Tolpygo et al. | |
| 2015/0191828 A1 | 7/2015 | Tolpygo et al. | |
| 2016/0298467 A1* | 10/2016 | Ucasz | .................. C23C 14/083 |

FOREIGN PATENT DOCUMENTS

| | | |
|---|---|---|
| EP | 1541712 A1 | 6/2005 |
| EP | 1550643 A2 | 7/2005 |
| EP | 1550737 A1 | 7/2005 |
| EP | 2894237 A1 | 7/2015 |

OTHER PUBLICATIONS

Wang, H. et al; Progress in Thermal Barrier Coatings for Gas Turbine Engines; Dec. 2012.

* cited by examiner

QUINARY, LOW-CONDUCTIVITY THERMAL BARRIER COATINGS FOR TURBINE ENGINE COMPONENTS

TECHNICAL FIELD

The inventive subject matter generally relates to thermal barrier coatings, and more particularly relates to quinary, low-conductivity thermal barrier coatings for turbine engine components.

BACKGROUND

Turbine engines are used as the primary power source for various kinds of vehicles, such as aircraft. Turbine engines may also serve as auxiliary power sources for various kinds of systems, such as air compressors, hydraulic pumps, and industrial electrical power generators. Most turbine engines generally follow the same basic power generation procedure. Specifically, compressed air is mixed with fuel and burned, and the expanding hot combustion gases are directed against stationary turbine vanes in the engine. The stationary turbine vanes turn the high velocity gas flow partially sideways to impinge onto turbine blades mounted on a rotatable turbine disk. The force of the impinging gas causes the turbine disk to spin at a high speed. Some turbine engines, such as jet propulsion engines, use the power created by the rotating turbine disk to draw more air into the engine, and the high velocity combustion gas is passed out of the turbine engine to create a forward thrust. Other engines use this power to turn one or more propellers, electrical generators, or other devices.

Because fuel efficiency improves as engine operating temperatures increase, turbine components such as engine blades and vanes are typically exposed to increasingly hotter gas temperatures. However, the ability to operate at these extreme temperatures is limited by the mechanical strength and corrosion resistance of the materials from which the turbine components are manufactured, as they may undesirably deform and/or oxidize and/or corrode when exposed to the combustion gases.

To improve oxidation and/or corrosion resistance, and to decrease surface temperature of the turbine components, a protective thermal barrier coating (TBC) may be applied on the component. For example, ceramic thermal barrier coatings (TBCs) are used on turbine components to increase temperature capability and efficiency of gas turbine engines. One ceramic TBC previously known in the art consists of a layer of 6-8 weight percent yttria-stabilized zirconia (7YSZ) deposited by an electron beam physical vapor deposition (EB-PVD) process or by plasma spray onto a metallic bond coat formed over the turbine component. Although 7YSZ is suitable for use as a TBC for certain engine operating temperature ranges, it may not be suitable for use in higher temperature ranges. In such cases, other more advanced ceramic TBCs, such as those that consist of lanthanide-base oxides with the general formula $A_2B_2O_7$, including but not limited to gadolinium zirconate, $Gd_2Zr_2O_7$ or neodymium zirconate, $Nd_2Zr_2O_7$, may be employed. Another example is fully-stabilized cubic zirconia, such as 20 weight percent yttria-stabilized zirconia (20YSZ). These more advanced ceramic TBCs have lower thermal conductivity and, therefore, may provide better thermal insulation as compared to 7YSZ. However, these oxides have significantly lower fracture toughness than 7YSZ, which limits TBC cyclic life and erosion resistance.

Commonly-assigned United States Patent Application Publication 2015/0191828 A1 discloses a quaternary TBC based on a tantala-zirconia mixture that is stabilized with yttria and ytterbia and/or gadolinia. The disclosed TBC has both high fracture toughness and a reduced thermal conductivity, as compared to the aforementioned conventional TBCs, such as 7YSZ. Additionally, the disclosed TBC exhibits corrosion resistance, sintering resistance, and high-temperature phase stability when subjected to turbine combustion gasses. Niobia can substitute for tantala in the disclosed TBC to control the cost of the system without significant deleterious effects to the material properties of the TBC in Publication 2015/0191828. The atomic mass of niobia is about half that of tantala and the cost of niobia tends to be lower than tantala. Partially substituting niobia for tantala during the preparation of the TBC of Publication is an effective means of reducing the cost.

Accordingly, there is a need for high-performance TBCs that exhibit high fracture toughness, reduced thermal conductivity, corrosion resistance, sintering resistance, and high-temperature phase stability as compared to the aforementioned conventional TBCs. Additionally, there is a need for such high-performance TBCs that partially or wholly avoid dependence on a single rare earth oxide, such as tantala. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Thermal barrier coatings having application in the manufacture of turbine engine components are provided. The thermal barrier coatings comprise or consist of a tantala-niobia-zirconia mixture that is stabilized with two or more stabilizers. An exemplary thermal barrier coating comprises or consists of, by mole percent: about 2% to about 30% $YO_{1.5}$; about 8% to about 30% $YbO_{1.5}$ or $GdO_{1.5}$ or a combination thereof; about 6% to about 30% $TaO_{2.5}$; about 0.1% to about 10% $NbO_{2.5}$; about 0% to about 10% $HfO_2$; and a balance of $ZrO_2$. The term "about" as used herein refers to either the exact value stated, or to a relative variance from the exact value of +/−10%, +/−5%, or +/−1%.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The inventive subject matter will hereinafter be described in conjunction with the following drawing figures, wherein like numerals denote like elements.

DETAILED DESCRIPTION

Figure 1:
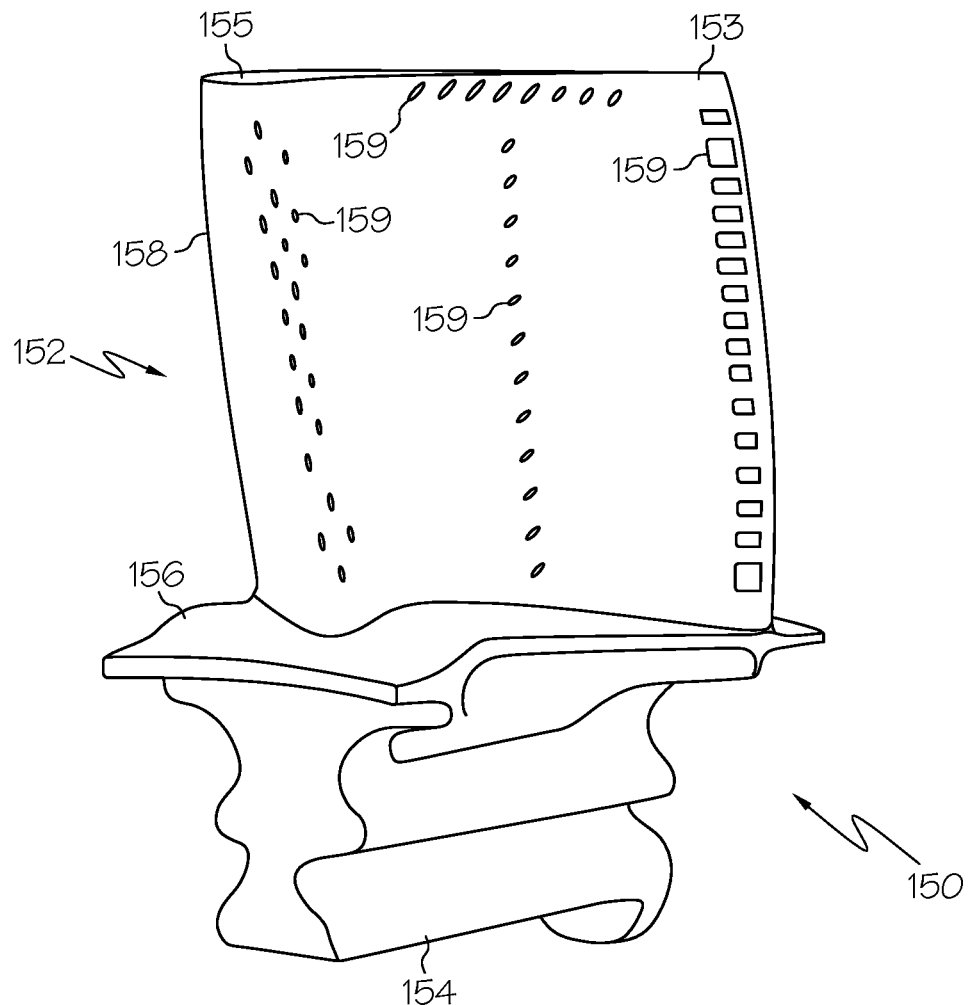
FIG. 1 is a perspective view of a turbine engine component, according to an embodiment.

The following detailed description is merely exemplary in nature and is not intended to limit the inventive subject matter or the application and uses of the inventive subject matter. Furthermore, there is no intention to be bound by any theory presented in the preceding background or the following detailed description.

A thermal barrier coating for use on a turbine engine component is provided that exhibits improved elevated-temperature properties as compared to conventional thermal barrier coatings, such as 7YSZ. The thermal barrier coating includes tantala, but does not require that the tantala have the common impurity of niobia removed. In an embodiment, the thermal barrier coating is formed from material having a particular chemical composition and structure. The chemistry and structure of the thermal barrier coating provides improved physical properties related to fracture toughness, thermal conductivity, corrosion resistance, sintering resistance, and high-temperature phase stability as compared to conventional thermal barrier coatings when the thermal barrier coating of the present disclosure is exposed to elevated engine operating temperatures (e.g., temperatures greater than about 2000° F. (1093° C.)).

In some embodiments of the present disclosure, a TBC is provided that comprises or consists of a tantala-niobia-zirconia mixture with two or more stabilizers. Stabilizers (also called dopants) are elements that allow the TBC to retain a stable tetragonal zirconia phase during service, even after long periods of exposure to elevated temperatures. A further aspect of the presently described embodiments is that the TBC is composed of one or more oxide phases, one of which is co-doped tetragonal zirconia, which is known to have high fracture toughness. Thus, one example in accordance with the present disclosure consists of zirconia stabilized with yttria and ytterbia, or yttria and gadolinia, or yttria, ytterbia, and gadolinia, and also contains tantala and niobia. The effect of the second stabilizer is a significant reduction of compositional variations across the thickness of the as-deposited TBC, as well as a more strain-compliant microstructure, both of which provide significant service-life improvement to the coating. Additionally, such combination of compounds exhibits a low thermal conductivity and improved fracture toughness.

The described embodiments allow for the production of a turbine engine component coated with the quinary TBC by, for example, electron beam physical vapor deposition, air plasma spray, or suspension plasma spray techniques. It has been demonstrated that the quinary TBC can be successfully deposited by evaporating a pre-formulated oxide mixture from a single source, which makes it practical and suitable for simultaneous treatment of several parts. Substitution of niobia for tantala in the preparation of the pre-formulated oxide mixture is expected to result in significant cost savings and cost volatility control in the production of the coated turbine engine component.

Turning now to the Figures, FIG. 1 illustrates a turbine engine component 150, according to an embodiment. Here, the turbine engine component 150 is shown as a turbine blade. However, in other embodiments, the turbine engine component 150 may be a turbine vane or other component that may be implemented in a gas turbine engine, or other high-temperature system. In an embodiment, the turbine engine component 150 includes an airfoil 152 including a pressure side surface 153 (and an opposite, non-illustrated suction side surface), an attachment portion 154, a leading edge 158 including a blade tip 155, and a platform 156. In an embodiment, the turbine engine component may be made from a superalloy material, such as a nickel-based superalloy. In accordance with an embodiment, the component 150 may be formed with a non-illustrated outer shroud attached to the tip 155. The turbine engine component 150 may have non-illustrated internal air-cooling passages that remove heat from the turbine airfoil 152. After internal air has absorbed heat from the airfoil 152, the air is discharged into a combustion gas flow path through passages 159 in the airfoil surfaces (e.g., 153). Although the turbine engine component 150 is illustrated as including certain parts and having a particular shape and dimension, different shapes, dimensions and sizes may be alternatively employed depending on particular gas turbine engine models and particular applications.

Figure 2:
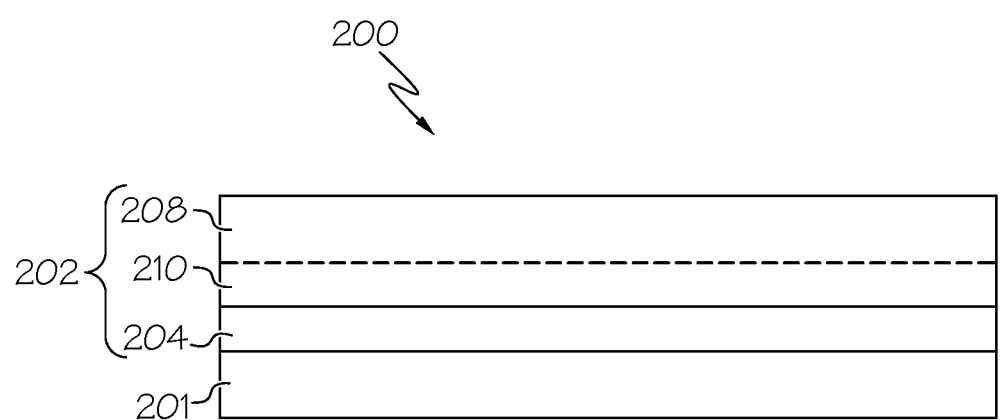
FIG. 2 is a simplified cross-sectional of a turbine engine component, according to an embodiment.

FIG. 2 is a cross-sectional view of a portion of a component 200, according to an embodiment. The component 200 may be, for example, a turbine airfoil such as the turbine airfoil 152 shown in FIG. 1 (or any other suitable turbine engine component) and may include a protective coating system 202 disposed over a substrate 201, wherein the substrate may be the superalloy material as described above. In an embodiment, the protective coating system 202 may include a bond coating 204, a quinary thermal barrier coating 208 as described in the present disclosure, and one or more optional intermediate layers 210 therebetween, such as a thermally grown oxide (TGO), or such as an intermediate layer of TGO and 7YSZ.

As noted above, the substrate 201, which may comprise a turbine engine component such as the turbine airfoil 152, may be fabricated as a single crystal superalloy component from a single crystal superalloy material. A "single crystal superalloy material" may be defined as a superalloy material formed to have a single crystallographic orientation throughout its entirety and being substantially free (e.g., less than about 1%) of high angle boundaries. Suitable single crystal superalloy materials include, but are not limited to nickel-based superalloys, cobalt-based superalloys, and the like. The substrate 201 may alternatively be fabricated as poly-crystalline superalloy materials, directionally solidified superalloys, high temperature steels, and high temperature Ni- and Co-base alloys, among various other substrates, for example.

The bond coating 204 is formed over the substrate 201 and bonds the quinary thermal barrier coating 208 and/or another layer to the substrate 201. In an embodiment, the bond coating 204 may be a diffusion aluminide coating. In other embodiments, the bond coating 204 may be an intermetallic aluminide such as nickel aluminide or platinum aluminide. In yet another embodiment, the bond coating 204 may be an overlay coating comprising MCrAlX, wherein M is an element selected from cobalt, nickel, or combinations thereof and X is an element selected from hafnium, zirconium, yttrium, tantalum, rhenium, ruthenium, palladium, platinum, silicon, or combinations thereof. The bond coating 204 may have a thickness in a range of from about 25 μm to about 250 μm, according to an embodiment. In other embodiments, the thickness of the bond coating 204 may be greater or less.

The thermal barrier coating 208 is formed over the substrate 201, and in an embodiment, may be formed over the bond coating 204 and optional intermediate layer(s) 210. In an embodiment, the thermal barrier coating 208 may be formed from the above-noted quinary, multi-phase material in order to provide improved physical properties when the material is exposed to elevated engine operating temperatures. As used herein, the term "quinary, multi-phase material" may be defined as a material comprising five or more constituents that, when combined together and subjected to particular deposition processes, may form two or more phases. As used herein, the term "phase" may be defined as a region of a material that is chemically and structurally uniform and distinct.

The chemical composition of the thermal barrier coating 208 is selected such that the TBC comprises or consists of tetragonal zirconia and optionally one additional phase. In some embodiment, a single phase tetragonal zirconia is possible. Examples of the optional second, third, etc. phases include but not limited to various tantalates, such as $YTaO_4$, or cubic zirconia, or orthorhombic phase, such as $Zr_6Ta_2O_{17}$. For example, one phase may be selected for high fracture toughness, another phase may be selected for low thermal conductivity, and/or other phases (if included) may be selected for corrosion resistance, erosion resistance or the like. In another embodiment, each phase may have varying degrees of a certain desirable properties. In accordance with an embodiment, the phases are selected such that they have limited solubility in each other, but may not all be present immediately upon deposition of the coating. It is possible and common that these coatings are applied as a single metastable phase and then upon subsequent heat treatments or in service decompose into the equilibrium phases that have limited solubility. In this way, the thermal barrier coating may retain structural stability and remain multi-phase during use. To provide the two or more aforementioned properties, the phases may comprise different oxide compounds. In an example, the oxide compounds may comprise either binary oxides or more complex oxides consisting of two or more metallic elements and oxygen.

As initially noted above, the thermal barrier coatings in accordance with the present disclosure comprise or consist of a tantala-niobia-zirconia mixture that is stabilized with two or more stabilizers. In some TBC compositions, yttria and ytterbia are selected as the two or more stabilizers. Thus, in one embodiment, the TBC may comprise or consist of (all percentages given herein in mole-percent) about 2% to about 30% $YO_{1.5}$ (yttria), about 8% to about 30% $YbO_{1.5}$ (ytterbia), about 6% to about 30% $TaO_{2.5}$ (tantala), about 0.1% to about 10% $NbO_{2.5}$ (niobia), about 0% to about 10% $HfO_2$ (hafnia) (it will be appreciated by those having ordinary skill in the art that the presence of hafnia in zirconia-based compositions may be unavoidable as an impurity in an amount of up to about 10%), and a balance of $ZrO_2$ (zirconia) and unavoidable trace and/or impurity constituents. As used herein, the term "balance" refers to an amount, in addition to the other stated elements, that equals 100 mole-percent. For zirconia, depending on the embodiment, "balance" could be equivalent from anywhere between about 10% on the low end to about 90% on the high end. In another embodiment, the TBC may comprise or consist of about 5% to about 30% $YO_{1.5}$, about 5% to about 30% $YbO_{1.5}$, about 5% to about 30% $TaO_{2.5}$, about 0.1% to about 10% $NbO_{2.5}$, about 0.1% to about 10% $HfO_2$, and a balance of $ZrO_2$ and unavoidable trace and/or impurity constituents. In yet another embodiment, the TBC may comprise or consist of about 10% to about 15% $YO_{1.5}$, about 10% to about 15% $YbO_{1.5}$, about 10% to about 20% $TaO_{2.5}$, about 0.1% to about 5% $NbO_{2.5}$, about 0.1% to about 2% $HfO_2$, and a balance of $ZrO_2$ and unavoidable trace and/or impurity constituents.

In other TBC compositions, yttria and gadolinia are selected as the two or more stabilizers. Thus, in one embodiment, the TBC may comprise or consist of about 2% to about 30% $YO_{1.5}$, about 8% to about 30% $GdO_{1.5}$ (gadolinia), about 6% to about 30% $TaO_{2.5}$, about 0.1% to about 10% $NbO_{2.5}$, about 0% to about 10% $HfO_2$, and a balance of $ZrO_2$ and unavoidable trace and/or impurity constituents. In another embodiment, the TBC may comprise or consist of about 5% to about 30% $YO_{1.5}$, about 5% to about 30% $GdO_{1.5}$, about 5% to about 30% $TaO_{2.5}$, about 0.1% to about 10% $NbO_{2.5}$, about 0.1% to about 10% $HfO_2$, and a balance of $ZrO_2$ and unavoidable trace and/or impurity constituents. In yet another embodiment, the TBC may comprise or consist of about 10% to about 15% $YO_{1.5}$, about 10% to about 15% $GdO_{1.5}$, about 10% to about 20% $TaO_{2.5}$, about 0.1% to about 5% $NbO_{2.5}$, about 0.1% to about 2% $HfO_2$, and a balance of $ZrO_2$ and unavoidable trace and/or impurity constituents. In accordance with any of the foregoing embodiments, combinations (in any ratio) of ytterbia and gadolina, equal to the stated amount of either the ytterbia or gadolina individually, are possible.

It will be appreciated that, in some embodiments as noted above, unavoidable trace and/or impurity constituents may be present. As used herein, the terms "trace" or "impurity" refer to constituents that are present in the composition in amount that are less than about 1% by mole, such as less than about 0.5% by mole. For example, such trace or impurity constituents may include, but are not limited to: titanium oxide, scandium oxide, cerium oxide, lanthanum oxide. Additionally, there may be trace impurities at less than about 0.1% by mole, for example less than about 0.05% by mole, such as: aluminum oxide, silicon oxide, magnesium oxide, and calcium oxide.

In accordance with an embodiment, the quinary, multi-stabilizer thermal barrier coating may be produced using an electron beam-physical vapor deposition (EB-PVD) process using one or more evaporation sources (ingots). Each ingot may consist of a separate oxide that may be either a pure (binary) oxide or a complex oxide, which has been selected for use as a starting material comprising a selected constituent. During deposition, electron beam(s) continuously or sequentially evaporates different ingots. Condensation of the oxides on a substrate produces a thermal barrier coating comprising a variety of different oxides. These oxides may already form one or more separate phases during deposition. Alternatively, post-deposition heat treatment may be used to precipitate oxide phases according to the corresponding equilibrium (and/or metastable) phase diagram. The amount and the distribution of individual oxides throughout a thickness of the thermal barrier coating can be varied by selecting specific electron beam dwell time per ingot, distance between the ingot and the part, electron beam power density and scan pattern.

In some embodiments, however, it is desirable to have the TBC coating be as consistent, with regard to phase composition, throughout its thickness as possible. When deposited via EB-PVD, in some embodiments, the thickness of the TBC 208 may be in a range of from about 25 μm to about 300 μm. Further, when deposited via EB-PVD, TBC 208 may exhibit a columnar microstructure. These "columns" are oriented substantially perpendicular to the surface of the substrate 201 and extend outward from the bond coat 204 (or optional intermediate layer 210). Between the individual columns are micron and sub-micron sized intercolumnar gaps that extend throughout the TBC.

In accordance with another embodiment, the thermal barrier coating may be produced using air plasma spray (APS) techniques or directed vapor deposition techniques, among other suitable deposition techniques. In embodiments wherein APS or other deposition techniques are employed, it is expected that the above-described columns will not be present in the TBC. Rather, the TBC will exhibit a polycrystalline structure that may include a plurality of inter-splat gaps, globular pores, and microcracks as is known in the art. Other embodiments deposited via APS contain between 5 and 35 volume percent pores in the form of inter-splat gaps, globular pores, and microcracks. The porosity may be created by typical means known by those familiar with the art such as, but not limited to, deposition of a finite fraction of powder particles that have not melted or by mixing the ceramic TBC powder with an organic filler material before or during the spray application of the coating. Still further embodiments deposited via APS will have a dense structure, containing between about 1 and about 10 volume percent pores, with vertical segmentation cracks running through the thickness of the TBC 208. The spacing of vertical segmentation cracks, when present, may be between about 20 and about 200 cracks per inch. When deposited via APS, in some embodiments, the thickness of the TBC 208 may be in a range of from about 50 μm to about 1500 μm.

In accordance with another embodiment, the thermal barrier coating may be produced using suspension plasma spray (SPS) techniques. In embodiments wherein SPS deposition techniques are employed, the TBC 208 may exhibit a columnar microstructure. These "columns" are oriented perpendicular to the surface of the substrate 201 and extend outward from the bond coat 204 (or optional intermediate layer 210). Between the individual columns are micron and sub-micron sized inter-columnar gaps that extend throughout the TBC 208.

ILLUSTRATIVE EXAMPLE

The present disclosure is now illustrated by the following prophetic, non-limiting example. It should be noted that various changes and modifications can be applied to the following example and processes without departing from the scope of this invention, which is defined in the appended claims. Therefore, it should be noted that the following prophetic example should be interpreted as illustrative only and not limiting in any sense.

A thermal barrier coating may be prepared in accordance with the foregoing description and contain, for example, about 10% $YO_{1.5}$, about 10% $YbO_{1.5}$, about 10% $TaO_{2.5}$, about 5% $NbO_{2.5}$, about 1% $HfO_2$, and a balance of $ZrO_2$ and unavoidable trace and/or impurity constituents. The thermal barrier coating may be deposited via EB-PVD to a superalloy substrate at a thickness of about 130 μm, on top of an intermediate series of layers consisting of a 60 μm thickness platinum modified aluminide bond coat, a 500 nm thickness thermally grown oxide, and a 5 μm thickness 7YSZ TBC. Such a thermal barrier coating may be tested for thermal conductivity. The example thermal barrier coating is expected to exhibit a thermal conductivity of about 1.1 to about 1.4 W/(m*K). These values compare favorably to standard 7YSZ coatings, which typically exhibit thermal conductivities in the range of about 2.0 to about 2.3 W/(m*K). Other comparable products in the patent literature have disclosed thermal conductivities that are lower than observed by the inventors herein with regard to the present disclosure, for example in the range of about 0.9 to about 1.3 W/(M*k); however, as will be discussed in the next paragraph, these comparable products detrimentally exhibit a poor fracture toughness.

The example thermal barrier coating may also be tested for fracture toughness. The example thermal barrier coating is expected to exhibit a fracture toughness of about 28 to about 30 J/m², which compares fairly well with the standard 7YSZ, which has a fracture toughness in the range of about 37 to about 43 J/m². In sharp contrast, the above noted comparable products in the literature, which had relatively low thermal conductivities, have detrimentally low fracture toughness.

Accordingly, a thermal barrier coating has been proposed that is expected to have both high fracture toughness and a reduced thermal conductivity, as compared to conventional thermal barrier coatings such as 7YSZ and as compared to comparable products in the literature. The improved thermal barrier coating may be capable of exhibiting corrosion resistance, sintering resistance, and/or high-temperature phase stability when subjected to the combustion gases of a turbine engine.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A thermal barrier coating composition comprising, by mole percent:
   about 2% to about 30% $YO_{1.5}$;
   about 8% to about 30% $YbO_{1.5}$ or $GdO_{1.5}$ or a combination thereof;
   about 6% to about 30% $TaO_{2.5}$;
   4.5% to 5.5% $NbO_{2.5}$;
   about 0% to about 10% $HfO_2$; and
   a balance of $ZrO_2$ and unavoidable trace and/or impurity constituents.

2. The thermal barrier coating composition of claim 1 comprising, by mole percent:
   about 10% to about 30% $YO_{1.5}$;
   about 10% to about 30% $YbO_{1.5}$ or $GdO_{1.5}$ or a combination thereof;
   about 10% to about 30% $TaO_{2.5}$;
   4.5% to 5.5% $NbO_{2.5}$;
   about 0.1% to about 10% $HfO_2$; and
   a balance of $ZrO_2$ and unavoidable trace and/or impurity constituents.

3. The thermal barrier coating composition of claim 2 comprising, by mole percent:
   about 10% to about 15% $YO_{1.5}$;
   about 10% to about 15% $YbO_{1.5}$ or $GdO_{1.5}$ or a combination thereof;
   about 10% to about 20% $TaO_{2.5}$;
   4.5% to 5.5% $NbO_{2.5}$;
   about 0.1% to about 3% $HfO_2$;
   a balance of $ZrO_2$ and unavoidable trace and/or impurity constituents; and
   having structure consisting of two or more phases, one of which being tetragonal zirconia.

4. The thermal barrier coating composition of claim 1 comprising, by mole percent:
   about 5% to about 10% $YO_{1.5}$;
   about 15% to about 20% $YbO_{1.5}$ or $GdO_{1.5}$ or a combination thereof;
   about 10% to about 20% $TaO_{2.5}$;
   4.5% to 5.5% $NbO_{2.5}$;

about 0.1% to about 3% $HfO_2$;
a balance of $ZrO_2$ and unavoidable trace and/or impurity constituents; and
having structure consisting of two or more phases, one of which being tetragonal zirconia.

5. The thermal barrier coating of claim 1, wherein a thickness of the thermal barrier coating is from about 1 micron to about 1500 microns.

6. The thermal barrier coating of claim 1, wherein a thickness of the thermal barrier coating is from about 25 to about 300 microns, and wherein the thermal barrier coating is deposited using electron beam physical vapor deposition (EB-PVD).

7. The thermal barrier coating of claim 1, wherein a thickness of the thermal barrier coating is from about 25 to about 1000 microns, and wherein the thermal barrier coating is deposited using air plasma spray (APS).

8. The thermal barrier coating of claim 1, comprising a metallic bond coat adjacent to the thermal barrier coating.

9. The thermal barrier coating of claim 1, wherein a microstructure of the thermal barrier coating is columnar, and wherein the thermal barrier coating is deposited electron beam physical vapor deposition (EB-PVD).

10. The thermal barrier coating of claim 1, wherein a microstructure of the thermal barrier coating is polycrystalline.

11. The thermal barrier coating of claim 1, wherein a microstructure of the thermal barrier coating is columnar, and wherein the thermal barrier coating is deposited using suspension plasma spray (SPS.

12. The thermal barrier coating of claim 1, wherein a microstructure of the thermal barrier coating has a plurality of inter-splat gaps, and wherein the thermal barrier coating is deposited using air plasma spray (APS).

13. The thermal barrier coating of claim 1, wherein a microstructure of the thermal barrier coating has a plurality of globular pores and wherein the thermal barrier coating is deposited using air plasma spray (APS).

14. The thermal barrier coating of claim 1, wherein a microstructure of the thermal barrier coating contains vertical segmentation cracks, and wherein the thermal barrier coating is deposited using air plasma spray (APS).

15. A thermal barrier coating composition consisting of, by mole percent:
about 2% to about 30% $YO_{1.5}$;
about 8% to about 30% $YbO_{1.5}$ or $GdO_{1.5}$ or a combination thereof;
about 6% to about 30% $TaO_{2.5}$;
4.5% to 5.5% $NbO_{2.5}$;
about 0% to about 10% $HfO_2$; and
a balance of $ZrO_2$ and unavoidable trace and/or impurity constituents.

16. The thermal barrier coating composition of claim 15 consisting of, by mole percent:
about 5% to about 30% $YO_{1.5}$;
about 5% to about 30% $YbO_{1.5}$ or $GdO_{1.5}$ or a combination thereof;
about 5% to about 30% $TaO_{2.5}$;
4.5% to 5.5% $NbO_{2.5}$;
about 0.1% to about 10% $HfO_2$; and
a balance of $ZrO_2$ and unavoidable trace and/or impurity constituents.

17. The thermal barrier coating composition of claim 16 consisting of, by mole percent:
about 10% to about 15% $YO_{1.5}$;
about 10% to about 15% $YbO_{1.5}$ or $GdO_{1.5}$ or a combination thereof;
about 10% to about 20% $TaO_{2.5}$;
4.5% to 5.5% $NbO_{2.5}$;
about 0.1% to about 3% $HfO_2$; and
a balance of $ZrO_2$ and unavoidable trace and/or impurity constituents.

18. The thermal barrier coating composition of claim 17 consisting of, by mole percent:
about 10% to about 15% $YO_{1.5}$;
about 10% to about 15% $YbO_{1.5}$ or $GdO_{1.5}$ or a combination thereof;
about 10% to about 20% $TaO_{2.5}$;
4.5% to 5.5% $NbO_{2.5}$;
about 0.1% to about 3% $HfO_2$;
a balance of $ZrO_2$ and unavoidable trace and/or impurity constituents; and
having structure consisting of one or more phases including tetragonal zirconia.

19. The thermal barrier coating of claim 15, wherein a thickness of the thermal barrier coating is from about 1 micron to about 1500 microns.

20. The thermal barrier coating of claim 15, wherein a thickness of the thermal barrier coating is from about 25 to about 300 microns, and wherein the thermal barrier coating is deposited using electron beam physical vapor deposition (EB-PVD.

21. The thermal barrier coating of claim 15, wherein a thickness of the thermal barrier coating is from about 25 to about 1000 microns, and wherein the thermal barrier coating is deposited using air plasma spray (APS).

22. The thermal barrier coating of claim 15, comprising a metallic bond coat adjacent to the thermal barrier coating.

23. The thermal barrier coating of claim 22, comprising an intermediate 7YSZ TBC layer between the metallic bond coat and the thermal barrier coating.

24. The thermal barrier coating of claim 15, wherein a thickness of the thermal barrier coating is from about 25 to about 1000 microns, and wherein the thermal barrier coating is deposited using suspension plasma spray (SPS).

25. The thermal barrier coating of claim 15, wherein a microstructure of the thermal barrier coating is columnar, and wherein the thermal barrier coating is deposited electron beam physical vapor deposition (EB-PVD).

26. The thermal barrier coating of claim 15, wherein a microstructure of the thermal barrier coating is columnar, and wherein the thermal barrier coating is deposited using suspension plasma spray (SPS).

27. The thermal barrier coating of claim 15, wherein a microstructure of the thermal barrier coating is dense with vertical segmentation cracks, and wherein the thermal barrier coating is deposited using air plasma spray (APS).

28. A turbine engine component comprising:
a substrate;
a bond coating provided over the substrate; and
a thermal barrier coating composition provided over the bond coat, wherein the thermal barrier coating composition consists of, by mole percent:
about 2% to about 30% $YO_{1.5}$;
about 8% to about 30% $YbO_{1.5}$ or $GdO_{1.5}$ or a combination thereof;
about 6% to about 30% $TaO_{2.5}$;
4.5% to 5.5% $NbO_{2.5}$;
about 0% to about 10% $HfO_2$; and
a balance of $ZrO_2$ and unavoidable trace and/or impurity constituents.

* * * * *